(12) United States Patent
Beyer et al.

(10) Patent No.: US 10,858,495 B2
(45) Date of Patent: Dec. 8, 2020

(54) POLYMER HYBRID MATERIAL FOR USE IN A SPLITTING METHOD

(71) Applicant: SILTECTRA GMBH, Dresden (DE)

(72) Inventors: Christian Beyer, Freiberg (DE); Jan Richter, Dresden (DE); Marko Swoboda, Dresden (DE)

(73) Assignee: Siltectra GmbH, Dresden (DE)

( * ) Notice: Subject to any disclaimer, the term of this patent is extended or adjusted under 35 U.S.C. 154(b) by 156 days.

(21) Appl. No.: 16/084,847

(22) PCT Filed: Mar. 23, 2017

(86) PCT No.: PCT/EP2017/056945
§ 371 (c)(1),
(2) Date: Sep. 13, 2018

(87) PCT Pub. No.: WO2017/162800
PCT Pub. Date: Sep. 28, 2017

(65) Prior Publication Data
US 2019/0071552 A1    Mar. 7, 2019

(30) Foreign Application Priority Data

Mar. 24, 2016  (DE) .................. 10 2016 105 616
Dec. 7, 2016   (DE) .................. 10 2016 123 679

(51) Int. Cl.
*C08K 3/08*   (2006.01)
*H01L 21/304* (2006.01)
(Continued)

(52) U.S. Cl.
CPC ............... *C08K 3/08* (2013.01); *C08J 5/18* (2013.01); *C08K 3/04* (2013.01); *C08K 3/041* (2017.05);
(Continued)

(58) Field of Classification Search
CPC . C08K 3/08; C08K 3/041; C08K 3/04; C08K 3/046; C08K 7/02; C08K 3/36;
(Continued)

(56) References Cited

U.S. PATENT DOCUMENTS 5,611,884 A    3/1997  Bearinger et al.
2005/0253286 A1  11/2005  Yoshikawa et al.
(Continued)

FOREIGN PATENT DOCUMENTS

DE       19640594 A1    4/1998
DE    102012001620 A1    8/2013
(Continued)

OTHER PUBLICATIONS

International Search Report issued in PCT/EP2017/056945 dated Jun. 29, 2017.

*Primary Examiner* — Karen Kusumakar
(74) *Attorney, Agent, or Firm* — Murphy, Bilak & Homiller, PLLC (57) ABSTRACT

A polymer hybrid material, a film comprising the polymer hybrid material, the use of the polymer hybrid material, a splitting method using the polymer hybrid material, and a method for producing the polymer hybrid material are provided for increasing the total yield, i.e. the efficiency with respect to the raw materials used and other resources such as energy and workforce, of a splitting method. The polymer hybrid material for use in a splitting method has at least two solid-body sections produced from a solid-body starting material. The polymer hybrid material comprises a polymer matrix and a first filler and a second filler embedded into the polymer matrix.

26 Claims, 3 Drawing Sheets

(51) Int. Cl.
*C08K 3/36* (2006.01)
*C08K 7/02* (2006.01)
*C08K 3/04* (2006.01)
*C08J 5/18* (2006.01)
*C08L 83/04* (2006.01)

(52) U.S. Cl.
CPC ................ *C08K 3/046* (2017.05); *C08K 3/36* (2013.01); *C08K 7/02* (2013.01); *H01L 21/304* (2013.01); *C08K 2003/085* (2013.01); *C08K 2003/0812* (2013.01); *C08K 2003/0856* (2013.01); *C08K 2003/0893* (2013.01); *C08L 83/04* (2013.01)

(58) Field of Classification Search
CPC .... C08K 2003/0893; C08K 2003/0856; C08K 2003/085; C08K 2003/0812; C08J 5/18; H01L 21/304; H01L 21/02; H01L 21/02008; H01L 21/02005; H01L 21/0201; H01L 21/02013; H01L 21/02016; H01L 21/02019; H01L 21/02021; H01L 21/02024; C08L 83/04
See application file for complete search history.

(56) References Cited

U.S. PATENT DOCUMENTS

| | | | |
|---|---|---|---|
| 2011/0028647 A1* | 2/2011 | Sixt | C09J 183/04 524/858 |
| 2011/0259936 A1* | 10/2011 | Lichtensteiger | B81C 1/00634 225/1 |
| 2013/0005116 A1* | 1/2013 | Bedell | H01L 21/304 438/462 |
| 2013/0217186 A1 | 8/2013 | Tani et al. | |

FOREIGN PATENT DOCUMENTS

| WO | 2009061353 A2 | 5/2009 |
|---|---|---|
| WO | 2010072675 A2 | 7/2010 |

\* cited by examiner

POLYMER HYBRID MATERIAL FOR USE IN A SPLITTING METHOD

CROSS REFERENCE TO RELATED APPLICATIONS

This application is the National Phase filing under 35 U.S.C. § 371 of International Application No.: PCT/EP2017/056945, filed on Mar. 23, 2017, and published on Sep. 28, 2017 as WO 2017/162800 A1, and claims priority to German Application No.: 10 2016 123 679.9, filed on Dec. 7, 2016, and to German Application No.: 10 2016 105 616.2, filed on Mar. 24, 2016. The contents of each of the prior applications are hereby incorporated by reference herein in their entirety.

BACKGROUND ART

The invention relates to a polymer hybrid material, to a film comprising the polymer hybrid material, to the use of the polymer hybrid material, to a splitting method using the polymer hybrid material and to a method for producing the polymer hybrid material.

Wafers, i.e., thin disks or plates, composed of materials such as silicon, germanium or sapphire are used especially in microelectronics and photovoltaics. At present, they are typically obtained from a column- or block-shaped solid body, which is also referred to as an ingot.

Cylindrical or discoidal pieces are generated from such ingots, for example by means of a sawing or severing method. Said pieces may already represent a wafer, or the pieces obtained are further subdivided until they have the desired thickness of a wafer to be produced.

In the sawing or severing method, wire saws or diamond wire saws are usually used, resulting in loss of a portion of up to 50% of the original solid body in the form of chips as so-called "kerf loss", this being especially disadvantageous in the case of expensive starting materials.

For example, with the methods that are typical at present, almost 50% of the material used are lost as "kerf loss" solely in the production of silicon wafers for solar cells. On a global scale, this corresponds to an annual loss of over 2 billion euros. Since wafer costs account for the largest share of the costs of the finished solar cell (over 40%), the costs of solar cells could be significantly reduced by appropriate improvements in wafer production.

Moreover, the sawing process frequently causes damage to the wafer surface, which must be eliminated by means of additional process steps for surface treatment, such as, for example, lapping or polishing method steps.

What appear to be particularly attractive for such wafer production without kerf-loss (kerf-free wafering) are methods which dispense with conventional sawing and can directly split off thin wafers from a thicker workpiece, for example through use of temperature-induced stresses. These include, in particular, methods as described, for example, in WO 2009/061353 A2 and WO 2010/072675 A2, where a polymer layer applied to the workpiece is used for generating said stresses.

In the methods mentioned, the polymer layer has a thermal expansion coefficient which is higher by about two orders of magnitude in comparison with the workpiece. In addition, by utilizing a glass transition, it is possible to achieve a relatively high modulus of elasticity in the polymer layer, with the result that sufficiently large stresses can be induced in the polymer layer-workpiece layer system by means of cooling in order to allow the split-off of wafer from the workpiece. Such a method is hereinafter referred to as a "splitting method".

In the split-off of a wafer from the workpiece, polymer is still adhering to one side of the wafer in each of the methods mentioned. At the same time, the wafer curves very strongly in the direction of this polymer layer, and this makes a controlled split-off difficult and may lead, for example, to thickness variations of the split-off wafer. In addition, the strong curvature makes further processing difficult and may even lead to the breakage of the wafer.

When using the prior-art methods, the wafers produced typically each exhibit relatively large thickness variations, wherein the spatial thickness distribution shows in many cases a pattern having multiple symmetry. When using the methods to date, the total thickness variation seen across the entire wafer (TTV) is in many cases more than 100% of the average wafer thickness (a wafer of, for example, 100 μm average thickness that is, for example, 50 μm thick at its thinnest point and 170 μm thick at its thickest point has a TTV of 170−50=120 μm, and this corresponds, relative to its average thickness, to a total thickness variation of 120%).

Wafers having such strong thickness variations are not suitable for many applications. In addition, in the case of the most commonly occurring tetradic thickness distribution patterns, the regions with the largest variations are unfortunately in the middle of the wafer, where they have the most disruptive effect.

In addition, in the prior-art method, undesired oscillations in the participating layer systems arise during the breaking propagation during the split-off itself, which oscillations may adversely influence the course of the breaking front and may, in particular, lead to significant thickness variations of the split-off wafer.

Furthermore, DE 10 2012 001 620 A1 discloses a method in which wafers are produced by attaching a polymer film to the solid body by means of an adhesive. After the adhesive has cured, the solid body together with the polymer film is thermally stressed. Owing to different thermal properties of solid body and polymer, the solid body breaks into two thinner pieces. Still adhering one-sidedly on one of the two pieces is, then, the polymer film, which must be removed from the surface in a subsequent step.

The described method can also be used for dividing a thick wafer into two thin wafers, by polymer films being adhesively bonded on both opposing sides of the thick wafer and it being split up into two thin wafers by means of an appropriate thermal treatment.

The effectiveness of such a method is, in particular, dependent on the selection of a polymer having a suitable glass transition temperature (Tg), on the thermal diffusivity of the polymer and on the mechanical properties thereof such as brittleness, tensile strength and elasticity.

Furthermore, DE 10 2012 001 620 A1 describes the use of an additional sacrifice layer between solid body and polymer film, which sacrifice layer serves for the improved removal of the polymer film after the split-off step, by the sacrifice layer being, for example, chemically degraded or detached by addition of suitable reactants.

However, a disadvantage of this method is the long period of time, which can be up to several hours, which elapses until a complete removal of the polymer layer. This greatly restricts industrial use.

To quicken the process of polymer removal, there is the possibility of introducing, by means of an appropriate pre-treatment, additional driving forces in the form of suitable tensile stress which act even at room temperature. These lead to an enlargement of the attack surface for the reactants or the solvent and favor degradation or favor detachment and dissolution.

However, the additional stresses introduced may also lead, after the removal of the polymer, to damage to the split solid body, i.e., to the wafer for example, by it breaking for example. This is associated with a deterioration of the total yield, which reduces the cost advantage of the splitting method.

Furthermore, WO 2010/072675 A2 discloses providing fillers in the polymer in order to be able to locally influence the thermal expansion coefficient or the modulus of elasticity.

However, it has been found that such fillers often impair the adhesion of the polymer on the surface of the solid body to be split, with the result that sufficient force transfer is no longer possible.

Moreover, according to the prior art, the poor thermal conductivity of the polymer means a long duration of cooling is required in order to be able to induce the necessary stresses.

In addition, it is difficult in the methods to date to ensure a reproducibly good thermal contact over the entire area of the polymer layer. However, locally insufficient thermal contact can, owing to the low thermal conductivity of the polymers used, lead to unwanted, significant local temperature deviations in the layer system, and this has, on its part, an adverse effect on the controllability of the stress fields generated and thus on the quality of the wafers produced.

Furthermore, publication DE 196 40 594 A1 discloses a method for separating semiconductor materials by means of light-induced interface degradation and devices produced thereby, such as structured and freestanding semiconductor layers and components.

The method according to DE 196 40 594 A1 involves the illumination of interfaces between substrate and semiconductor layer or between semiconductor layers, and as a result, light absorption at the interface or in an absorption layer intended therefor leads to material degradation. The selection of the interface or semiconductor layer which is brought to degradation is done via the choice of light wavelength and light intensity, the incident-beam direction or the incorporation of a thin sacrifice layer during material production.

This method has the disadvantage that high energy doses must be used for the degradation of entire layers, and as a result, the energy demand and thus the costs of the method are very high.

SUMMARY OF THE INVENTION

It is therefore an object of the present invention to provide a way of increasing the total yield, i.e., the efficiency with regard to the raw materials used and the other resources such as energy and workforce, of a splitting method.

In particular, it is intended that the duration of cooling and the time course of polymer removal after the splitting of the solid body be influenced in a specific manner.

Preferably, it is intended that the polymer be separable from the divided starting material in a rapid manner, without residue, and without damage to said starting material.

Moreover, it is intended that process stability be increased by minimizing the number of method steps.

Investigations have shown that the removal of the polymer layer by degradation, detachment or dissolution is a diffusion-controlled reaction of the participating reactants and solvents. Over the course of time, the inward and outward transport of the reactants in the gap which forms between solid body and polymer is increasingly hampered and slowed down to a very great extent. Thus, the inward and outward transport of the reaction products and reactants and of the solvent and also of the dissolved constituents is the diffusion-controlled rate-determining step.

Therefore, what is provided according to the invention is a polymer hybrid material for use in a splitting method, in which at least two solid-state pieces are generated from one solid-state starting material.

The polymer hybrid material according to the invention comprises a polymer matrix and a first filler embedded therein. Where mention is made below of a filler or the filler, it is intended that the possibility of multiple fillers likewise be included. For example, the filler can comprise a mixture of various materials, for example metal particles and inorganic fibers.

The polymer matrix used can be any polymer or a mixture of various polymers that makes it possible to generate the necessary stresses for splitting the solid-state starting material. For example, the polymer matrix can be in the form of an elastomer matrix, preferably a polydiorganosiloxane matrix, particularly preferably a polydimethylsiloxane matrix.

Such polymer materials can be used with particular ease as matrix material in combination with fillers, since the properties can, owing to the variable degree of crosslinking, be adjusted in a flexible manner and adapted to the particular filler and to the solid-state starting material to be divided.

According to one embodiment, the proportion by mass of the polymer matrix, based on the polymer hybrid material, is from 80% to 99%, preferably from 90% to 99%.

The first filler can be organic or inorganic in nature and consist either of a chemical element or of a chemical compound or a mixture of substances, for example an alloy.

The first filler is configured such that it acts as reactant, initiator, catalyst or promoter during the detachment of the polymer hybrid material from the solid-state piece after the division and, as a result, leads to a more rapid detachment of the polymer hybrid material from the solid-state piece after the division in comparison with a polymer material without first filler.

The specific chemical composition and design of the first filler and the proportion by mass thereof is, in this connection, especially dependent on the specific material of the polymer matrix which is to be detached, the solvent used therefor and the reactants used. Furthermore, the material of the solid-state starting material and the dimensions of the solid-state starting material to be divided are also important.

The specific proportion of the first filler in the polymer matrix is highly dependent on the material of the filler and the mode of action thereof. Firstly, the polymer matrix must, in spite of filler, still be able to perform its task of generating stresses. Secondly, the proportion of the first filler must be sufficiently high to achieve the influencing of polymer removal that is striven for. The optimal proportion by mass of the first filler for a particular case can be ascertained by a person skilled in the art as part of simple experiments carried out in a concentration-dependent manner.

To improve the mechanical properties, it is additionally possible for a further filler to make a contribution, such as, for example, fumed silica in the form of an inorganic network in the polymer. Besides these strong interactions in the form of the network, less strong interactions due to purely hydrodynamic reinforcements can also make a contribution to the improvement.

By way of example, mention can be made here of a specific increase in viscosity, which allows an improved processing in the splitting method and can thus contribute to improved manufacturing tolerances. Furthermore, this interaction hampers a reduction in the inner degrees of freedom with respect to a structural reorientation with increasing reinforcement.

This leads to a desired lowering of the glass transition temperature of the polymer used in the polymer hybrid material, allowing the advantage of a lower temperature in the splitting method.

According to the invention, the first filler is used in a polymer hybrid material to quicken the detachment of the polymer hybrid material from a solid-state piece which is obtained by division by means of a splitting method in which a solid-state starting material is divided into at least two solid-state pieces.

The first filler can be distributed in the polymer matrix such that the proportion by mass of the first filler decreases proceeding from the outer, i.e., lower, interface of the polymer hybrid material, which interface is connected to the solid-state staring material during the splitting method, in the direction of a further interface of the polymer hybrid material that is arranged in parallel to the lower interface. This means that the proportion by mass of the filler close to the solid-state starting material or piece is greater than in the other regions of the polymer hybrid material.

This distribution of the first filler allows a particularly effective removal of the polymer hybrid material after the separation, since the first filler is situated close to the interface with the solid-state piece, where it can unfold its effect. At the same time, the remaining regions of the polymer hybrid material have fewer or absolutely no proportions of the first filler, meaning that the function of the polymer is minimally influenced.

In one embodiment, the polymer hybrid material is configured in a layered manner, wherein only one layer facing the solid-state starting material comprises the first filler, whereas the remaining polymer hybrid material is free of the first filler.

Furthermore, a lower region of the polymer hybrid material that directly adjoins to the lower interface thereof can be free of the first filler. This can give rise to a sequence of regions as follows: adjacent to the solid-state starting material is situated, first of all, a region without first filler, followed by a region with a high proportion of first filler and then a region with a low proportion of first filler or without first filler.

These regions, and all regions described below, can be in the form of layers, i.e., the region extends overwhelmingly in parallel to the interface of the solid-state starting material to which the polymer hybrid material is applied and has a longitudinal and transverse extent at least in the region of said interface.

A lower region without first filler can, in particular, be provided in the event of the first filler impairing the adhesion of the polymer hybrid material on the solid-state starting material. To avoid this, a region without first filler is first arranged, followed by a region with a high proportion of first filler, so that the first filler can perform its function. A lower layer without first filler can, for example, have a thickness between 10 μm and 500 μm, for example 100 μm.

Furthermore, an upper region of the polymer hybrid material that directly adjoins to the upper interface thereof can be free of the first filler. The upper interface is, in this connection, to be understood to mean the interface which delimits the polymer hybrid material opposite the lower interface and the solid-state starting material with respect to the environment. Lower and upper interface can be arranged in parallel to one another.

Such an upper region without first filler can, in particular, be provided when the first filler adversely influences the heat transfer between environment and polymer hybrid material, for example if the cooling of the polymer hybrid material would be delayed.

The first filler can comprise a material or consist of a material that can react with a reactant, preferably an oxidizing agent, to release a gaseous product.

As a result, it is possible to generate, in the polymer matrix, cavities which allow a more rapid access by the reactants and solvents to the polymer matrix and any sacrifice layer present and, moreover, bring about a more rapid outward transport of the reactants and dissolved constituents.

Owing to the generation of gaseous reaction products, it is possible to introduce additional driving forces which further support the removal of the polymer hybrid material.

The formation of additional cavities and the evolution of gaseous reaction products quickens the removal of polymer and therefore contributes to increasing the total yield of the splitting method. By varying the proportion of first filler, it is possible to specifically influence the cavity density in the border region between solid-state piece and polymer hybrid material or between sacrifice layer and polymer hybrid material.

The first filler can comprise a metal, more particularly aluminum, iron, zinc and/or copper, or consist of a metal, more particularly the aforementioned metals.

With reference to all the materials mentioned here, "consisting of" includes the fact that technology-related impurities or technology-related admixtures, which are, for example, useful in the production of the fillers and the distribution or attachment thereof to the polymer matrix, may be present.

Metallic fillers can react with oxidizing agents such as, for example, hydrochloric acid, nitric acid, citric acid, formic acid or sulfamic acid to release a gaseous product and, as a result, be removed from the polymer hybrid material.

For example, aluminum reacts with concentrated hydrochloric acid to form solvated metal ions and hydrogen according to the following equation:

$$6HCl+2Al+12H_2O \rightarrow 2[AlCl_3 * 6H_2O]+3H_2$$

Similarly, the reaction of zinc as filler, by means of reaction with concentrated hydrochloric acid, leads to the formation of additional cavities:

$$Zn+2HCl \rightarrow ZnCl_2+H_2$$

In the examples mentioned, the generation of hydrogen introduces additional driving forces which further support the removal of the polymer hybrid material.

Moreover, the first filler can improve the thermal diffusivity within the polymer hybrid material, for example by the first filler having a higher thermal diffusivity than the polymer of the polymer matrix. This may, for example, be the case when the first filler comprises a metal. Owing to an improved thermal diffusivity, it is possible for the stresses generated for the division of the solid-state starting material by means of cooling to be generated more effectively, i.e., more rapidly and with low consumption of coolant. This can increase the total yield of the splitting method.

Furthermore, according to the invention, what is be provided in the polymer hybrid material is a second filler which increases the adhesion of the polymer hybrid material on the solid-state starting material in comparison with a polymer hybrid material without second filler. Preferably, the adhesion is increased in comparison with a polymer material without filler.

For example, the second filler can be a filler which can be activated by means of plasma. The plasma activation results in new surface species which can be created such that a stronger interaction with the surface of the solid-state starting material results and, ultimately, the adhesion of the polymer hybrid material is improved.

The nature of the surface species achievable by the plasma treatment is, in this connection, primarily dependent on the process control of the plasma process. For example, gases such as nitrogen, oxygen, silanes or chlorosilanes can be added during the plasma treatment, resulting in, for example, polar groups, which can interact more strongly with the surface of the solid-state starting material.

The second filler can be distributed in the polymer matrix such that the proportion by mass of the second filler increases in the direction of the lower interface. For example, the polymer hybrid material can contain the second filler only in a region adjacent to the lower interface, it also being possible for the region to be in the form of a layer in the context of the definition stated above.

This allows the arrangement of the second filler preferably in the proximity of the interface between polymer hybrid material and solid-state starting material, resulting in the adhesion being improved and thus making possible a greater force transfer into the solid-state starting material to be divided.

For example, the second filler can comprise core-shell polymer particles. In this connection, preference is given to particles, the polymer composition of which differs from the polymer matrix of the polymer hybrid material to the effect that especially the surface, i.e., the shell, of the core-shell particles is more strongly activatable, for example by means of low-temperature plasmas. Examples thereof are core-shell particles comprising a polysiloxane core with an acrylate shell or comprising a nanoscale silicate core with an epoxide shell or comprising a rubber particle core with an epoxide shell or comprising a nitrile rubber particle core with an epoxide shell.

The second filler can be activatable by means of low-temperature plasma, for example cold plasma. For example, the plasma can be generated by means of dielectric barrier discharge (DBD). Here, electron densities within the range from 1014 to 1016 m-3 can be generated. The average temperature of the DBD-generated "cold" nonequilibrium plasma (plasma volume) is approx. 300±40 K at ambient pressure.

In the case of the DBD treatment, the surface is, for example, treated with unipolar or bipolar pulses of pulse lengths of a few microseconds up to tens of nanoseconds and amplitudes in the single-digit to double-digit kilovolt range. Here, no metallic electrodes in the discharge space and thus no metallic impurities or electrode wear and tear are to be expected.

Moreover, a high efficiency is advantageous, since no charge carriers must escape or enter on the electrodes. Dielectric surfaces can be modified and chemically activated at low temperatures. The surface modification can, for example, be achieved by an interaction and reaction of the surface species as a result of ion bombardment.

Furthermore, it is possible to specifically add process gases, such as, for example, nitrogen, oxygen, hydrogen, silanes or chlorosilanes, for example $Si_xH_yE_z$ where E=F, Cl, Br, I, O, H and x=0 to 10, z=0 to 10, $SiH_4$, $Si(EtO)_4$ or Me3SiOSiMe3, in the case of a plasma treatment in order to generate, for example, certain chemical groups on the surface.

Furthermore, the second filler can be activatable by means of corona treatment, flame treatment, fluorination, ozonization or UV treatment or eximer irradiation.

Such an activation generates, for example, polar groups at the surface of the second filler that can interact with the surface of the solid-state starting material and thus improve the adhesion.

Furthermore, the polymer hybrid material can additionally comprise a third filler in comparison with a polymer hybrid material having a first filler or in comparison with a polymer hybrid material having a first filler and a second filler.

Said third filler has a higher thermal diffusivity and/or a higher modulus of elasticity in comparison with the polymer of the polymer matrix.

For example, the modulus of elasticity of the polymer under low-temperature conditions is in the lower single-digit gigapascal range (approx. 1-3 GPa), whereas metallic fillers have, for example, a modulus of elasticity in the two-digit to three-digit gigapascal range. With an appropriate high proportion of filler, a percolating filler network is possible, allowing an improved "coupling-in of force" into the solid-state starting material.

The percolation is substantially influenced by the degree of volume filling of the particular fillers (e.g., 0.1% by volume, 1% by volume to 10% by volume depending on the aspect ratio). With increasing application of force, the viscoelastic layer structure of the polymer structure can be impacted and multiple percolation paths can come into effect. Here, improved heat transfers can be made possible, since what can occur is an improved contact of the fillers with the surface of the solid-state starting material.

The mechanical stability of the polymer hybrid material is also reached more rapidly at low temperatures. In total, what can occur are a lower standard deviation of the corresponding structure-property profiles such as, for example, breaking stress and elongation at break of the polymer hybrid material and thus an increase in the total yield of the splitting method. The spatially resolved property profile changes (stress peaks in the polymer hybrid material) and thus in the solid body are smaller, leading to a higher total yield of the splitting method and a better quality of the solid-state pieces generated.

The third filler can bring about an improved heat transfer between environment and polymer hybrid material and a more rapid heat conduction within the polymer hybrid material, meaning that the polymer hybrid material can be cooled more rapidly and the splitting method can, overall, be carried out more rapidly and thus more effectively.

Increasing the modulus of elasticity makes it possible to generate higher stresses for the division of the solid-state starting material, meaning that it is also possible to divide solid-state starting materials for which a particularly high stress is required.

Moreover, the third filler can also serve to influence the thermal expansion coefficient. In this connection, the goal is a greatest possible difference between the thermal expansion coefficient of the polymer hybrid material and of the solid-state starting material to be divided in order to be able to generate additional stresses required for the division. Preferably, the third filler has a high thermal expansion coefficient, i.e., an expansion coefficient which is higher than that of the polymer matrix. For example, the thermal expansion coefficient of the third filler can be more than 300 ppm/K.

The third filler can be distributed in the polymer matrix such that the proportion by mass of the third filler increases in the direction of the upper interface in order to allow a more rapid heat transfer especially at the interface with the environment.

The third filler can comprise a metal, more particularly aluminum, iron, zinc and/or copper, or consist of one of the metals mentioned. Metals are generally distinguished by a high thermal conductivity and thermal diffusivity.

The described fillers (first, second, third filler) can be distributed in particulate form in the polymer matrix, it being possible for the particle size to be in the µm and nm range, based on at least one dimension of the particle. Besides a spherical shape, it is also possible for the filler particles to assume other configurations, for example a rod shape or discoidal shape.

The filler particles can exhibit all particle size distributions, for example monomodal or bimodal, narrow, especially monodisperse, or broad. The fillers can be attached to the polymer matrix both physically, for example by embedding into the polymer network, and chemically.

Furthermore, one or more of the described fillers can comprise inorganic or organic fibers, for example carbon fibers, glass fibers, basalt fibers or aramid fibers, or consist of such fibers, provided that the above-described functions are compatible therewith. Optionally, it is also possible to add a further filler which comprises the fibers mentioned or consists of such fibers.

Fibers typically have highly anisotropic properties. By means of a direction-dependent positioning of the filler in the polymer hybrid material, it is possible to specifically influence the stresses required for dividing the solid-state starting material. This can contribute to increasing the total yield of the splitting method.

An additional advantage when an organic or inorganic filler is used in the form of fibrous material having a highly anisotropic structure is that an improvement in the mechanical properties within the polymer hybrid material can be achieved as a result.

Moreover, the described fillers can comprise core-shell particles or consist thereof. Additionally or alternatively, it is possible to provide a further filler comprising or consisting of core-shell particles in the polymer hybrid material.

Besides an improved activatability, the use of core-shell polymer particles additionally also allows a new form of energy-absorbing mechanisms which can lead, in total, to an increase in impact strength and fracture toughness, more particularly an increase in low-temperature impact strength, of the polymer hybrid material when used in the splitting method and can thus likewise contribute to a higher total yield of the splitting method. For example, mechanical destruction of a film composed of a polymer hybrid material can occur with a lower probability, with the result that the option of reusing the film can be promoted.

By way of example, prevention of crack propagation by means of core-shell polymer particles can avert film destruction in the splitting method and thus introduce ways of recycling.

Here, elastomer particles present can undergo a plastic deformation and form cavities, and as a result, further additional energy can be absorbed. Similarly, it is possible to compensate for an additional energy absorption by the shear flow of the matrix, and this improves overall the mechanical properties.

Core-shell particles are distinguished by the fact that a generally spherical core composed of one material is surrounded by a shell composed of a second material. The shell can either completely encase the core or else be permeable as well.

The materials can be both inorganic materials, such as metals for example, or organic materials, such as polymers for example. For example, two different metals can be combined with one another. However, it is also possible to surround a core composed of a polymer with a shell composed of a metal or a second polymer.

Core-shell particles make it possible to combine the properties of the first and second material. For example, the size and density of the filler particles can be determined via an inexpensive polymer core, whereas the metallic shell can react as described above. Moreover, owing to their often monodisperse particle size distribution, it is possible to predict and adjust the properties of the core-shell particles with precision.

Furthermore, one or more fillers (first, second and/or third filler) can comprise carbon in the form of carbon black, graphite, chopped carbon fibers, carbon nanofibers, preferably in the form of carbon nanotubes (CNT), such as, for example, multi-walled carbon nanotubes (MWCNT) and single-walled carbon nanotubes (SWCNT), or consist thereof.

Carbon nanotubes are cylindrical graphite plies which are made up of a differing number of cylinders. If these tubes only consist of one cylinder, they are referred to as single-walled carbon nanotubes (SWCNT). If two or more cylinders are present, there are either double-walled carbon nanotubes (DWCNT) or multi-walled carbon nanotubes (MWCNT). Said cylinders can preferably be nested in one another in a concentric manner.

According to various embodiments, the third filler can comprise MWCNTs or consist thereof, since they have a particularly high thermal conductivity ($>3000$ $W*(m*K)-1$) and have, at the same time, a very high tear strength within the range of 5-60 GPa. In this connection, the high mechanical stability shows itself in high tear values, extreme elasticity and a very good durability of the filler.

The basis therefor are the strong sp2-hybridized σ C—C bonds associated with a delocalized p-orbital as Π bond in relation to three adjacent carbon atoms. Here, deflections of up to 90° are possible.

With SWCNTs, it is possible to achieve even higher property values (modulus of elasticity: from 410 GPa to 4150 GPa versus 1000 GPa for graphite; SWCNTs: thermal conductivity approx. 6000 $W*(m*K)-1$). However, a poorer performance/cost ratio in comparison with MWCNTs becomes apparent here. The cylindrical diameters of MWCNTs are typically within the range from 1 nm to 100 nm, preferably from 5 to 50 nm, with a length of from 500 nm to 1000 µm.

According to further embodiments, the third filler can comprise MWCNTs and, at the same time, the second and/or first filler can comprise carbon black or consist thereof, since an improvement in the thermal conductivity (e.g., up to 200 $W*(m*K)-1$) can likewise be achieved here. Since the use of, by way of example, carbon black has a distinctly lower tear strength with values of <0.4 GPa, a combination of two or further fillers is possible and can lead to an improvement in the total split yield and to an improvement in the total costs in the splitting method.

Here, the average diameters of the carbon black particles are within the range from 5 nm to 500 nm, preferably from 20 nm to 200 nm, particularly preferably from 40 nm to 100 nm. Furthermore, the fillers can comprise silica, for example fumed silica, or consist thereof. Additionally or alternatively, it is possible to provide a further filler comprising or consisting of silica in the polymer hybrid material.

Fumed silica can form a three-dimensional network and, as a result, contribute to improving mechanical stability. Thus, such a filler can serve for the specific adjustment of the mechanical properties of the polymer hybrid material.

One or more of the fillers mentioned (first, second, third filler) can consist of the same material, provided that this is compatible with the function attributed thereto. For example, both the first and the third filler can comprise aluminum or consist of aluminum. As described above, aluminum can be used not only for generating cavities and thus for quickening the detachment of the polymer hybrid material from the solid-state piece, but also for increasing thermal diffusivity. Such a configuration simplifies the production process, since it can suffice to add only one or two fillers in order to satisfy all functions.

First and second and possibly third filler can also consist of different materials. An individual and thus better adaptation of the filler to the desired function is made possible as a result.

A film according to the invention comprises a polymer hybrid material as described above. The film can have a thickness of, for example, from 0.5 to 5 mm.

The polymer hybrid material according to the invention or a film according to the invention can be used in a splitting method for dividing a solid-state starting material into at least two solid-state pieces.

More particularly, the polymer hybrid material can be used in a splitting method in which multiple cylindrical, preferably discoidal, solid-state pieces, more particularly wafers, are generated from one cylindrical solid-state starting material.

In this connection, cylinder is to be understood to mean a body delimited by two parallel, planar, congruent surfaces (base surface and cover surface) and a lateral surface or cylindrical surface, wherein the lateral surface is formed by parallel lines. Preferably, base surface and cover surface are circular and lie above one another in a congruent manner, resulting in a straight circular cylinder. Nevertheless, other cylindrical forms, for example with base surfaces having n corners where n=3, 4, 5 or 6, are also conceivable, preference being given to base surface and cover surface lying above one another in a congruent manner.

According to the present description, a solid-state starting material is understood to mean a monocrystalline, polycrystalline or amorphous material. Because of the highly anisotropic atomic bonding forces, monocrystalline materials having a highly anisotropic structure are preferably suitable. The solid-state starting material preferably comprises a material or a combination of materials from one of the main groups 3, 4, 5 and/or 12 of the periodic table, more particularly a combination of elements from the 3rd, 5th and 12th main group, or consists of such a material, such as, for example, silicon Si, silicon carbide SiC, SiGe, germanium Ge, gallium arsenide GaAs, indium phosphide InP, gallium nitride GaN, aluminum oxide Al2O3 (sapphire), aluminum nitride AlN.

In addition, the semiconductor starting material can, for example, also comprise zinc oxide ZnO, gallium(III) oxide Ga2O3, gallium phosphide GaP, indium arsenide InAs, indium nitride InN, aluminum arsenide AlAs or diamond or consist of such a material.

Furthermore, the solid-state starting material can comprise a ceramic (e.g., Al2O3-aluminum oxide) or consist of a ceramic; in this connection, preferred ceramics are, for example, perovskite ceramics (such as, for example, Pb-, O-, Ti/Zr-containing ceramics) in general and lead magnesium niobates, barium titanate, lithium titanate, yttrium aluminum garnet, more particularly yttrium aluminum garnet crystals for solid-state laser applications, SAW ceramics (surface acoustic wave), such as, for example, lithium niobate, gallium orthophosphate, quartz, calcium titanate, etc., in particular.

Thus, the solid-state starting material preferably comprises a semiconductor material or a ceramic material or the solid body particularly preferably consists of at least one semiconductor material or one ceramic material. Furthermore, it is conceivable that the solid body comprises a transparent material or consists of or is made from, in part, a transparent material, such as sapphire for example.

Further materials which are possible here as solid-state starting material, either alone or in combination with a different material, are, for example, "wide band gap" materials, InAlSb, high-temperature superconductors, more particularly rare earth cuprates (e.g., YBa2Cu3O7). Additionally or alternatively, it is conceivable that the solid-state starting material is a photomask, it being possible to use as photomask material in the present case preferably any photomask material known on the date of filing and particularly preferably combinations thereof.

A splitting method according to the invention comprises the following steps: first of all, the solid-state starting material to be divided, having an exposed surface, is provided. The solid-state starting material can be obtained as described above, for example it can have a cylindrical shape and consist of one of the cited materials.

A polymer hybrid material according to the invention or a film according to the invention is applied to at least said surface, resulting in a corresponding composite structure. The applied polymer hybrid material and the applied film are hereinafter also referred to as absorption layer. The thickness of such an absorption layer can, for example, be between 0.5 mm and 5 mm.

Optionally, the polymer hybrid material or the film can also be applied to multiple exposed surfaces, more particularly to surfaces arranged in parallel to one another.

More particularly, the solid-state starting material can be a cylindrical one. In this case, the polymer hybrid material or the film is applied to an exposed base surface and/or cover surface. This can, for example, be achieved by adhesive bonding of a film consisting of the polymer hybrid material.

The application of the polymer hybrid material to the exposed surface of the solid-state starting material can also be achieved by the polymer hybrid material being directly generated on said surface, for example by the below-described method for producing a polymer hybrid material being carried out on said surface. For instance, a precursor substance of the polymer hybrid material can be applied from a liquid phase on the exposed surface of the solid-state starting material, followed by a physical and/or chemical process, for example evaporation and/or crosslinking reactions, to form the actual polymer hybrid material.

Subsequently, the composite structure is treated with a stress field such that the solid-state starting material is split into at least two solid-state pieces along a plane of detachment within the solid-state starting material.

The stress field can be achieved by thermal treatment of the absorption layer, for example by sudden cooling or heating, more particularly by sudden cooling using liquid nitrogen, the stress field arising owing to the different thermal expansion coefficients of the solid-state starting material and of the polymer hybrid material as well as the resultant significant change in the modulus of elasticity.

The thermal treatment is preferably a cooling of the absorption layer below the ambient temperature and preferably below 10° C. and particularly preferably below 0° C. and further preferably below −10° C. or below −40° C.

Most preferably, the cooling of the absorption layer is carried out such that at least one portion of the absorption layer makes a glass transition. Here, the cooling can be a cooling to below −100° C., which can, for example, be brought about using liquid nitrogen. This embodiment is advantageous, since the absorption layer contracts and/or undergoes a glass transition depending on the temperature change and the resultant forces are transferred onto the solid-state starting material, making it possible to generate in the solid body mechanical stresses which lead to the initiation of a crack and/or to crack propagation, the crack first propagating along the first plane of detachment to split off the solid-state layer.

In a further step, the polymer hybrid material or the film is removed from the solid-state piece, for example by means of a chemical reaction, a physical detachment process and/or mechanical removal.

The process of detaching the polymer hybrid material from the solid-state piece can take place at moderate ambient temperature, for example within the range from 20° C. to 30° C., preferably within the higher temperature range from 30° C. to 95° C., for example from 50° C. to 90° C., or else, for example, in a lower temperature range between 1° C. and 19° C. as well.

The elevated temperature range can make it possible to shorten a chemical detachment reaction owing to an increase in the reaction rate, for example when using a sacrifice layer between the polymer hybrid material and the solid body. When using a sacrifice layer, the detachment can take place in aqueous solution, advantageously at a pH within the range of 2-6.

According to various embodiments, the detachment process can, by way of example, be carried out in the form of a treatment with a solution composed of a suitable apolar solvent, with moderate ambient temperatures within the range from 1° C. to 50° C. and from 20° C. to 40° C. being, respectively, preferred and particularly preferred.

A particular advantage here is the detachment without a temperature effect on the film. Here, it is advantageously possible to use aliphatic and aromatic hydrocarbons such as, for example, toluene, n-pentane, n-hexane, but also halogenated solvents, such as, for example, carbon tetrachloride. Here, additional forces can be introduced into the polymer hybrid material to be detached and into the interface with the solid-state piece, since a solvent treatment means that a very strong reversible swelling of the polymer hybrid material can occur, and as a result, the detachment is simplified overall.

According to further embodiments, it is possible to carry out a combination comprising the above-described mechanism of detachment of the sacrifice layer and the treatment with a suitable apolar solvent—likewise without temperature effect on the film.

According to further embodiments, the polymer hybrid material or the film can be removed from the solid-state piece by using a sequential order and/or a partial or complete planar treatment with suitable polar solvents, such as, for example, primary or secondary alcohols, for example methanol, ethanol, isopropanol, or ketones, such as, for example, acetone, butanone, ethyl methyl ketone, cyclohexanone, followed by a partial or complete treatment with an apolar solvent, advantageously an aliphatic hydrocarbon, such as, for example, n-pentane, n-hexane, or aromatic hydrocarbon, such as, for example, toluene, or a halogenated solvent, such as, for example, carbon tetrachloride, or a silicone oil or kerosene.

Here, moderate ambient temperatures within the range from 1° C. to 50° C. and within the range from 20° C. to 30° C. are, respectively, preferred and particularly preferred. It is likewise possible to carry out a combination comprising the above-described mechanism of detachment of the sacrifice layer and the sequential treatment with a suitable polar and apolar solvent.

According to further embodiments, the polymer hybrid material or the film can be removed from the solid-state piece by carrying out, additionally and also separately, a spatially resolved ultrasound treatment or megasound treatment (frequency range above 400 kHz to 2 MHz) of the solid-state pieces containing the polymer hybrid material. The ultrasound treatment can also be done in a frequency-modulated manner in order to allow, for example, a more homogeneous energy distribution on the solid-state piece.

For the ultrasound range, it is possible to use power sound having a frequency range of from 20 kHz to 100 kHz or else high-frequency sound having a frequency range of from 100 kHz to 1 MHz.

In liquid media, said frequencies lead to cavitation processes with aftereffects, such as, for example, collapsing cavitation bubbles. At phase boundaries, such as, for example, between the solid-state piece and the polymer hybrid material, what occur within the nanosecond range are implosion and deformation of dynamically forming cavitation bubbles and the formation of a microjet.

The spatially resolved energy output occurs in the form of enormous adiabatic heating on a very small space owing to the very rapid compression of the gas. Extreme temperatures of up to 5000 kelvins and pressures up to 500 bar occur here, which allow new physical detachment mechanisms and chemical detachment reactions in the region of the boundary layer that would otherwise not take place.

These enormous pressure difference result from the recoil of the bubble front in an outward direction (imploding shock wave). Highly elevated detachment reaction rates are the result here.

According to further embodiments, a planar megasound and/or ultrasound treatment, additionally downstream, may be advantageous, since what is made possible here is penetration even into distinctly smaller structures, for example μm structures in the case of a megasound treatment. Thus, it is possible to realize particularly high quality/cleanliness requirements, such as, for example, in the case of semiconductor wafers.

Between the solid-state starting material and the polymer hybrid material or the film, it is optionally possible to provide a sacrifice layer, which simplifies the removal of the polymer hybrid material or the film after division has been achieved, for example by the sacrifice layer being degraded by a suitable chemical reaction.

Whereas the polymer matrix serves for the generation of the stresses required for dividing the solid-state starting material, the above-described tasks are the responsibility of the filler(s).

More particularly, the first filler can quicken the removal of the polymer hybrid material or the film, by the inward and outward transport of the solvent and of the dissolved constituents and of the reaction reactants and products being improved. As a result, the additional stresses hitherto required according to the prior art can be reduced through to being dispensed with altogether, with the result that the damage they cause to the solid-state pieces can be avoided. Ultimately, the result is a shortened process time and an improved total yield.

Moreover, the process stability of the overall method is increased, since fewer process steps are required owing to the possibility of dispensing with the introduction of additional stresses.

If the polymer matrix and/or the fillers are not subject to a chemical reaction, the reuse thereof is, moreover, possible. For example, a film according to the invention may be suitable for reuse.

Reusing a separated film according to the invention that is composed of polymer hybrid material always requires that the viscoelastic film behavior does not substantially change as a result of the detachment process. Here, the possible distance changes with an appropriate application of force should change only to the extent that the resulting tensile forces can be provided homogeneously for separation and crack propagation without film damage occurring.

Mechanical damage, especially in the edge region of the film (e.g., tears), may be particularly disadvantageous here, since this leads, with a high probability, only to a partial removal of the film and reuse may be made difficult.

According to various embodiments, the separated solid-state piece can be fixed via a vacuum chuck having a channel structure or preferably a pin structure, it being possible to achieve a force distribution in the solid-state piece that is as uniform as possible. This is followed by the treatment with the apolar or polar solvent suitable for the particular case.

In general, it is possible, once there has been sufficient local delamination, to carry out manual peeling, or else the polymer hybrid material or the individual film is completely separated from the solid-state piece with the aid of a roll-to-roll process.

For such a roll-to-roll process, it is possible, in an intermediate step, for a temporary auxiliary support to be adhesively bonded and/or preferably hot-laminated onto the polymer hybrid material or the polymer hybrid film, with distinctly higher adhesive forces being generated between the temporary auxiliary support and the film in comparison with the boundary layer of the film with respect to the solid-state piece. What are crucial here are the temperature of the participating rollers, the rotational speed, the roller pressure and the feeding speed. Typically, a relatively low rotational speed, a relatively high roller pressure and a relatively low feeding speed can favor a better adhesion of the film on the auxiliary support.

Thus, a complete separation of the film according to the invention from the solid-state piece is possible in the downstream roll-to-roll process.

According to further embodiments, the temporary auxiliary support can, in each substep before feeding, be cleaned and subsequently activated by a plasma treatment. This allows an improved binding of the temporary auxiliary support to the film.

In further embodiments, the temporary auxiliary support can be used repeatedly in the form of an endless belt.

The removal of the polymer hybrid material or of the film can be quickened such that it is possible to dispense with an additional sacrifice layer. This contributes to further simplification and thus to increasing the process stability of the splitting method.

The polymer hybrid material or the film can be directly applied to the exposed surface of the solid-state starting material or an intermediate sacrifice layer can be provided.

The polymer hybrid material or the film can be activated by means of low-temperature plasma, for example cold plasma, before the application to the surface of the solid-state starting material or to the sacrifice layer. In this connection, an activation of the polymer matrix and/or of the fillers can take place as described above. Additionally or alternatively, the surface of the solid-state starting material or the sacrifice layer can, moreover, be plasma-treated.

This promotes a more homogeneous and more adjustable adhesion on the solid-state starting material or the sacrifice layer and allows a better force transfer.

For example, a specific plasma treatment makes it possible to realize a spatially resolved surface morphology. This can be used for desired target profiles such as, for example, differently spatially resolved adhesion or cohesion properties of the surface of the polymer hybrid material and/or of the surface of the solid-state starting material and/or of the adjoining sacrifice layer.

A film according to the invention can be directly applied to the surface of the solid-state starting material or to the sacrifice layer by means of lamination or adherence. Lamination allows a better adhesion, especially in the edge region. This can largely avoid breakage of the solid-state material in the edge region during the division, and as a result, the scrap rate can be reduced.

Optionally, it is possible to specify a plane of detachment within the solid-state starting material by means of at least one radiation source, for example by means of a laser. This makes it possible to precisely define the position of the plane of detachment, allowing a very small TTV, more particularly smaller than 200 µm or 100 µm or smaller than 80 µm or smaller than 60 µm or smaller than 40 µm or smaller than 20 µm or smaller than 10 µm or smaller than 5 µm, more particularly smaller than 4, 3, 2, 1 µm.

The beam treatment of the solid-state starting material thus creates, in a first step, a kind of perforation inside the solid-state starting material, along which perforation there is crack propagation in a second step or along which perforation the solid-state piece is separated from the solid-state starting material.

To provide the radiation to be introduced into the solid-state starting material, at least one or exactly one radiation source can be configured such that the beams emitted therefrom generate the defects at predetermined sites within the solid-state starting material. This embodiment is advantageous, since it is possible to generate defects in the solid-state starting material with extreme precision by means of a radiation source, more particularly by means of a laser.

The radiation source can be adjusted such that the beams emitted therefrom for generating the plane of detachment penetrate into the solid-state starting material to a defined depth, more particularly to a depth <100 µm. Preferably, the plane of detachment is spaced in parallel to an outer and preferably planar surface of the solid-state starting material. Preferably, the plane of detachment is spaced, within the solid-state starting material, less than 100 µm and preferably less than 50 µm and particularly preferably less than or equal to 20, 10, 5 or 2 µm away from the planar surface of the solid-state starting material.

The solid body can be treated with a specified wavelength and/or output, the specified wavelength preferably being adapted to the particular material. This embodiment is advantageous, since it is possible to influence the defect size by means of the wavelength and/or the output.

The solid-state starting material can be arranged on a holding layer for holding the solid body, wherein the holding layer is arranged on a first planar surface component of the solid-state starting material, wherein the first planar surface component of the solid-state starting material is spaced away from a second planar surface component of the solid-state starting material, wherein the absorption layer is arranged on the second planar surface component and wherein the plane of detachment is aligned in parallel or is generated in parallel with respect to the first planar surface component and/or the second planar surface component.

This embodiment is advantageous, since the solid-state starting material is arranged at least sectionally and preferably completely between the holding layer and the absorption layer, and as a result, it is possible by means of one of these layers or by means of both layers to introduce the stresses for crack generation or crack propagation into the solid body.

The holding layer can be arranged on an at least sectionally planar surface of a stabilization mechanism which consists at least partially of at least one metal.

The stabilization mechanism is preferably a plate, more particularly a plate which comprises aluminum or consists thereof. This embodiment is advantageous, since the stabilization mechanism and the holding layer define or hold firmly the solid-state starting material, and as a result, the stresses can be generated very precisely in the solid-state starting material.

The stresses can be adjustable or generatable in the solid body such that it is possible to control the crack initiation and/or the crack propagation for generating a topography of the surface arising in the plane of cracking. The stresses are thus generatable to varying degrees preferably in different regions of the solid body preferably at least intermittently. This embodiment is advantageous, since controlling the crack initiation and/or the crack progression makes it possible to advantageously influence the topography of the generated or separated solid-state layer.

A method according to the invention for producing the above-described polymer hybrid material comprises adding one or more fillers to a monomer, to a monomer solution or to an uncrosslinked polymer, preferably to an uncrosslinked polydimethylsiloxane. This mixture is polymerized and/or crosslinked during or after the addition of the filler(s).

Alternatively, the filler(s) can also be added to a polymer melt, with the result that the polymer hybrid material is obtained by cooling to a temperature below the melting temperature.

The distribution of the filler(s) in the polymer matrix can be controlled by the rate of polymerization and/or crosslinking or cooling. To this end, what is utilized is the fact that the viscosity changes owing to the polymerization, crosslinking or cooling, with the result that the sedimentation rate of the fillers decreases.

By an appropriate movement of the mixture of filler and polymer matrix during the polymerization, crosslinking or cooling, it is, for example, possible to achieve a uniform distribution of filler.

By contrast, owing to the influence of the gravitational force of the Earth, a slow polymerization, crosslinking or cooling without any movement leads to an accumulation of filler in the region close to the Earth on the basis of sedimentation, provided that the filler has a higher density than the polymer matrix. This can be utilized for the accumulation of the filler in the border region with respect to the solid-state starting material or with respect to the sacrifice layer, for example in order to generate cavities there in a specific manner by appropriate reactions.

The distribution of the filler(s) in the polymer matrix can also be controlled by other influencing of the sedimentation rate of the filler(s).

The sedimentation is influenced not only by the ratio of the densities of filler and polymer matrix, but also by the particle shape. A highly anisotropic particle shape especially with a high nonrotationally symmetric aspect ratio, as is characteristic of fibers for example, leads, for example, to a delay in the sedimentation and to a gradually changing distribution of filler within the polymer matrix.

Aspect ratio is preferably understood as the ratio of length to diameter, length to width, or length to thickness.

In this connection, the largest extent of a particle in one of the directions of space is always selected as length.

Thus, the aspect ratio is always greater than or equal to one. The aspect ratio of one corresponds to a perfect spherical shape. Deviations from a spherical shape are described with aspect ratios greater than one.

For example, fibers typically have a very high aspect ratio (highly anisotropic particle shape).

Depending on the fillers used or the combination of fillers, the aspect ratio of the filler particles can be greater than 100, 1000, 10 000, in many cases even greater than 100 000 (e.g., in the case of carbon nanotubes), it not being intended that the present invention be restricted thereto.

Also, additional stabilizations due to superstructures, which counteract sedimentation, may occur in the case of highly anisotropic filler particles. Moreover, three-dimensional scaffold structures, which further hamper sedimentation, are possible in the case of nanoscale filler particles, with the result that the properties can be specifically influenced especially in the border region.

Furthermore, Stoke's equation, which is based on Stoke's law, reveals that the particle radius squared is related to the sedimentation rate:

$$v_P = \frac{2r^2 g(\rho_P - \rho_f)}{9\eta}$$

where $v_p$ . . . sedimentation rate
r . . . radius of the sinking particle
g . . . acceleration due to gravity
$\rho_p$ . . . density of the particle
$\rho_f$ . . . density of the fluid
$\eta$ . . . dynamic viscosity of the fluid According to this, the sedimentation rate decreases especially in the case of submicroscale and nanoscale particles over the course of the polymer crosslinking reaction.

Moreover, one or more of the fillers to be added can act as inhibitor. Additionally or alternatively, one or more inhibitors can also be added. This can, for example, prevent an unwanted premature polymerization.

For example, one of the introduced fillers can additionally act as reaction inhibitor. Said inhibitors can have a substantial influence on the crosslinking reaction, for example by appropriate free-radical scavengers or stabilizers slowing the reaction rate.

Here, it is possible to specifically slow the storage stability of the individual components, but also the actual crosslinking reaction to form the polymer hybrid material. Thus, longer pot lives and an extension of the processing time in the overall process of producing the polymer hybrid material are possible.

In the case of a polysiloxane network, it is possible to achieve a distinct slowing of the crosslinking with the aid of, for example, fumarate- or maleate-based inhibitors, 2-methylbutyn-3-ol-2, 3,5-dimethyl-1-hexyn-3-ol or preferably with tetramethyltetravinylcyclotetrasiloxane. In the case of the quadruply functional tetramethyltetravinylcyclotetrasiloxane, it is possible to obtain additional crosslinking points in the polymer network.

In the case of silicone matrices, such as, for example, polydimethylsiloxane, which are cured by UV radiation, it is also possible to adjust the necessary crosslinking time additionally by means of a filler acting as inhibitor. This is done by slowing the reaction rate by means of appropriate free-radical scavengers or stabilizers. Thus, the storage stability of the monomer, of the monomer solution or of the uncrosslinked polymer is accordingly increased by the prevention of an unwanted premature polymerization or crosslinking.

This is also possible in the case of systems to be crosslinked thermally, for example by addition of sulfur, amine-containing substances, tetramethyltetravinylcyclotetrasiloxane, 2-methylbutyn-3-ol-2 or by addition of dimethyl fumarate and dimethyl maleate in systems which are vulcanized at room temperature (RTV systems). Moreover, it is possible, with respect to industrial processing, to adjust the so-called pot life, with the result that useful batch sizes can be realized.

With the aid of the described processes, the properties of the polymer hybrid material can be specifically adapted to the particular solid-state starting material and the process conditions of the splitting method. For example, it is possible for a filler which primarily serves for the creation of cavities and thus the improved removal of the polymer hybrid material to be arranged in the border region with respect to the solid-state piece, whereas a further filler for improving heat conduction, for example the above-described third filler, can be distributed with maximum uniformity in the polymer hybrid material or is primarily arranged in the border region with respect to the environment.

Optionally, the polymer hybrid material obtained according to the described method can be supplemented by a filler-free layer. This means that it is, for example, possible to obtain a distribution of the filler in the polymer matrix, in which a filler-free layer is first followed by a region having a high proportion of filler and, after this, the proportion of filler decreases.

For example, this may be advantageous if the filler adversely influences the adhesion of the polymer hybrid material on the solid-state starting material, but a high filler concentration is nevertheless required in the border region with respect to the solid-state starting material in order to be able to detach the polymer hybrid material more rapidly from the solid-state piece after division has been achieved.

Furthermore, the subject matter of German patent application 10 2013 016 666.7 is fully incorporated by reference in the subject matter of the present patent application. Similarly, the subject matter of all further patent applications likewise filed by the applicant on the filing date of the present application and of all further patent applications relating to the field of production of solid-state layers is fully incorporated in the subject matter of the present patent application.

BRIEF DESCRIPTION OF THE DRAWING FIGURES

Further advantages, goals and properties of the present invention will be elucidated by means of the following description of attached drawings, which depict the wafer production according to the invention by way of example. Components or elements of the wafer production according to the invention that, in the figures, coincide at least substantially with respect to their function can be labeled here with identical reference signs, there being no need for said components or elements to be numbered or elucidated in all the figures.

Individual representations or all representations of the figures described below are preferably to be considered as design drawings, i.e., the dimensions, proportions, functional relationships and/or arrangements that are revealed by the figure(s) correspond preferably exactly or preferably substantially to those of the device according to the invention or of the product according to the invention.

In the drawings.

DETAILED DESCRIPTION

Figure 1A:
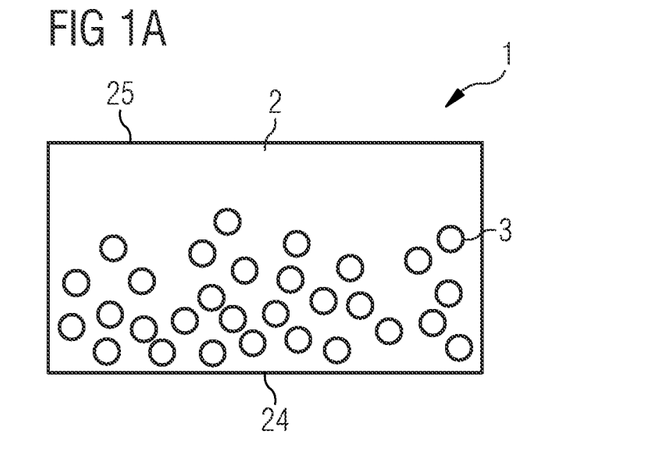
FIG. 1a shows a schematic representation of a polymer hybrid material containing a first filler.

FIG. 1a shows a polymer hybrid material 1, in which a first filler 3 is embedded in a polymer matrix 2. The polymer matrix 2 in the example consists of PDMS. The first filler 3 acts as reactant in a splitting method during the detachment of the polymer hybrid material 1 from the solid-state piece 7 after the division and, as a result, allows a more rapid detachment of the polymer hybrid material 1 from the solid-state piece 7 after the division in comparison with a polymer material without first filler.

In the example, the first filler 3 consists of aluminum or zinc, meaning that a gaseous product can arise through reaction with hydrochloric acid.

The first filler 3 is distributed along a gradient in the polymer matrix 2. The proportion by mass of the first filler 3 is highest in the region of the lower interface 24 and decreases in the direction of the upper interface 25.

Figure 1B:
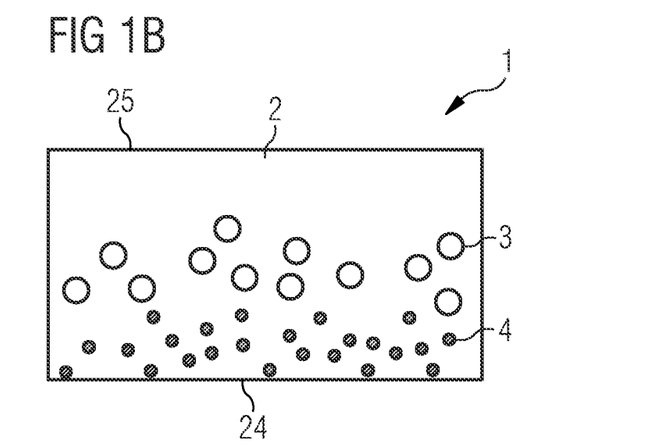
FIG. 1b shows a schematic representation of a polymer hybrid material according to the invention containing a first and a second filler.

FIG. 1b shows, by way of example, one embodiment of the polymer hybrid material 1 according to the invention, there being, in comparison with the embodiment according to FIG. 1a, a further second filler 4.

Said second filler 4 improves the adhesion of the polymer hybrid material 1 on the solid-state starting material 6 in comparison with a polymer hybrid material 1 without second filler 4.

The second filler 4 is distributed in the polymer matrix 2 such that its proportion by mass increases in the direction of the lower interface 23 and can be activated preferably by means of cold plasma.

Figure 1C:
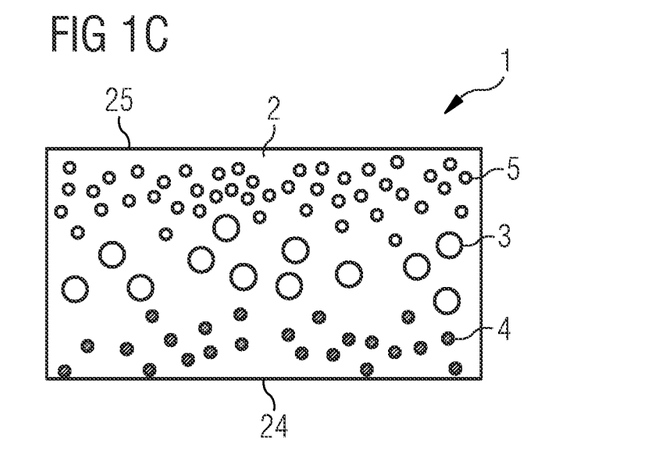
FIG. 1c shows a schematic representation of a polymer hybrid material containing a first, second and third filler.

FIG. 1c shows, by way of example, a further embodiment of the polymer hybrid material 1, there being, in comparison with the embodiment according to FIG. 1b, a further third filler 5.

Said third filler 5 comprises a metal and has a higher thermal diffusivity in comparison with the polymer of the polymer matrix 2. The third filler 5 exhibits the highest proportion in a region adjacent to the upper interface 25.

In all three embodiments according to FIGS. 1a, 1b and 1c, the proportion by mass of the polymer matrix 2, based on the polymer hybrid material 1, is 90% or more.

Figure 2A:
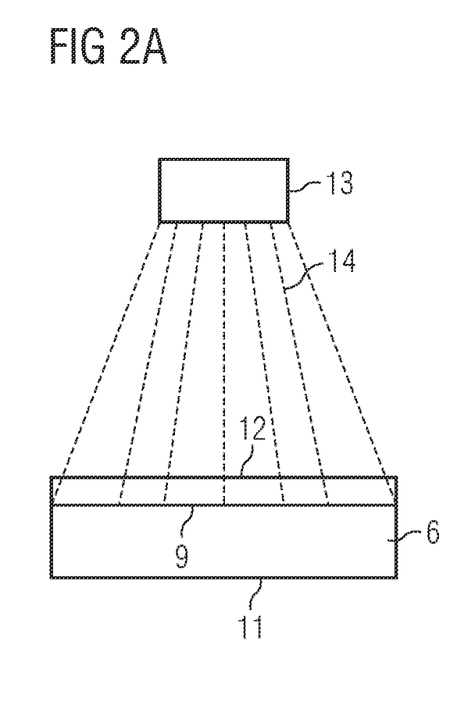
FIG. 2a shows a schematic setup for generating defects in a solid body.

FIG. 2a shows a solid-state starting material 6 which is arranged in the region of a radiation source 13, more particularly a laser. The solid-state starting material 6 preferably has a first planar surface component 11 and a second planar surface component 12, the first planar surface component 11 preferably being aligned in parallel, either substantially or exactly, to the second planar surface component 12.

The first planar surface component 11 and the second planar surface component 12 preferably delimit the solid-state starting material 6 in a Y-direction, which is preferably aligned in a vertical or perpendicular manner. The planar surface components 11 and 12 both preferably extend in an X-Z plane, the X-Z plane preferably being aligned in a horizontal manner.

Furthermore, it can be gathered from FIG. 2a that the radiation source 13 emits radiation 14 onto the solid-state starting material 6. Depending on the configuration, the radiation 14 penetrates into the solid-state starting material 6 to a defined depth and generates a defect at the particular position or at a predetermined position.

Figure 2B:
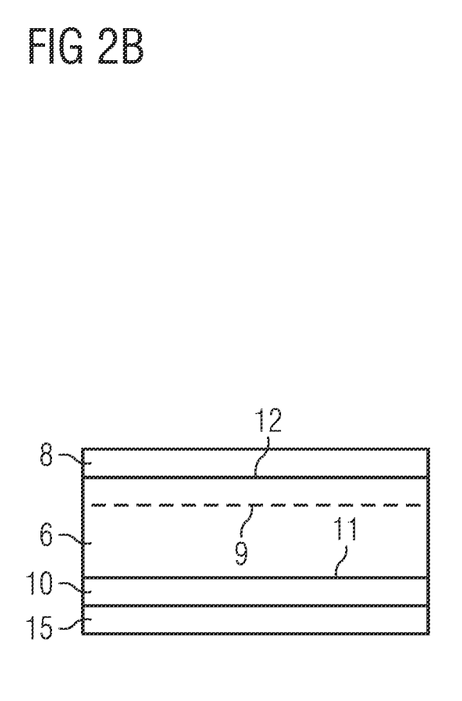
FIG. 2b shows a schematic representation of a layered arrangement before the separation of a solid-state layer from a solid body.

FIG. 2b shows a multilayer arrangement, wherein the solid-state starting material 6 contains the plane of detachment 9 and is, in the region of the first planar surface component 11, provided with a holding layer 10, which is, in turn, preferably overlaid by a further layer, the further layer preferably being a stabilization mechanism 15, more particularly a metal plate.

Arranged on the second planar surface component 12 of the solid-state starting material 6 is an absorption layer 8, which consists of polymer hybrid material 1. In the example, the solid-state starting material 6 comprises silicon and/or gallium or perovskite and the polymer matrix 2 of the polymer hybrid material 1 and/or the holding layer 10 consist, at least partially and preferably completely or to an extent of more than 75% (proportion by mass), of polydimethylsiloxane (PDMS).

Figure 2C:
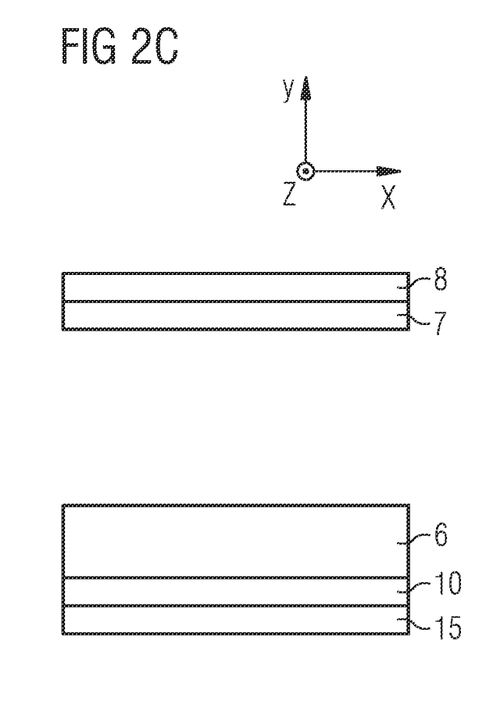
FIG. 2c shows a schematic representation of a layered arrangement after the separation of a solid-state layer from a solid body.

FIG. 2c shows one state after a crack initiation and subsequent crack guidance. The solid-state piece 7 adheres to the accommodation layer 8 and is spaced or spaceable away from the remainder of the solid-state starting material 6.

Figure 3A:
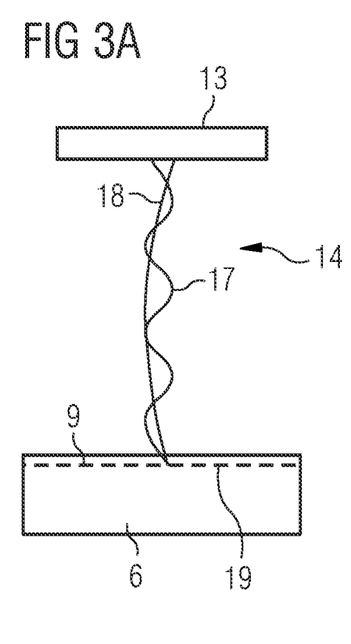
FIG. 3a shows a first schematically represented variant for defect generation using light waves.
Figure 3B:
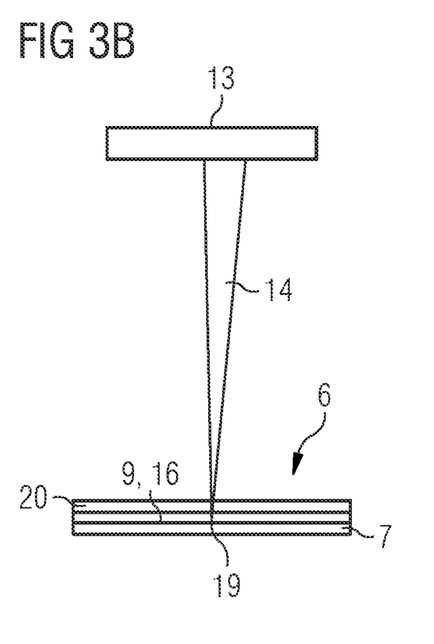
FIG. 3b shows a second schematically represented variant for defect generation using light waves.

FIGS. 3a and 3b show examples of the generation of a plane of detachment 9, as shown in FIG. 2a, by the introduction of defects into a solid-state starting material 6 by means of light radiation 14.

By means of the polymer hybrid material 1 according to the invention, it is intended that solid-state pieces 7 in the form of solid-state layers, solid-state plates or wafers having a uniform thickness be produced in a cost-effective manner using the below-described method by way of example. More particularly, a TTV of less than 120 μm is achieved thereby.

The method elucidated by way of example uses a polymer hybrid material 1 according to the invention, as has been described in detail above, it being possible for the polymer hybrid material to be in the form of a film. In this connection, said method preferably comprises at least the steps:

of providing a solid-state starting material 6 for the separation of at least one solid-state piece 7 in the form of a solid-state layer, of generating defects 19 using at least one radiation source 13, more particularly a laser, in the inner structure of the solid-state starting material 6 to specify a plane of detachment 9, along which the solid-state piece 7 is separated from the solid-state starting material 6, of arranging an absorption layer 8 consisting of the polymer hybrid material 1 according to the invention, of thermally treating the absorption layer 8 to generate, more particularly mechanically generate, stresses in the solid-state starting material 6, the stresses resulting in a crack propagating in the solid-state starting material 6 along the plane of detachment 9, which crack separates the solid-state piece 7 from the solid-state starting material 6; removing the polymer hybrid material 1 from the solid-state piece 7.

This solution is advantageous, since the radiation source makes it possible to generate the detachment layer or defect layer in the solid-state starting material, through which the crack is conducted or guided during the crack propagation, this making it possible to realize very small TTVs, more particularly smaller than 200 μm or 100 μm or smaller than 80 μm or smaller than 60 μm or smaller than 40 μm or smaller than 20 μm or smaller than 10 μm or smaller than 5 μm, more particularly smaller than 4, 3, 2, 1 μm.

The thermal treatment is preferably a cooling of the absorption layer below the ambient temperature and preferably below 10° C. and particularly preferably below 0° C. and further preferably below −10° C.

Most preferably, the cooling of the absorption layer is carried out such that at least one portion of the absorption layer makes a glass transition. Here, the cooling can be a cooling to below −100° C., which can, for example, be brought about using liquid nitrogen.

FIG. 3a thus shows schematically how it is possible to generate defects 19 in a solid-state starting material 6, more particularly for generating a plane of detachment 9 using a radiation source 13, more particularly one or more lasers.

In this connection, the radiation source 13 emits radiation 14 comprising a first radiation component 17 having a first wavelength and comprising a second radiation component 18 having a second wavelength. In this connection, the two wavelengths of the first and second radiation component 17, 18 are coordinated and the distance between the radiation source 13 and the plane of detachment 9 to be generated is coordinated such that the radiation components 17, 18 substantially or exactly meet on the plane of detachment 9 in the solid-state starting material 6, resulting in defects 19 being generated at the meeting site as a consequence of the energies of the two radiation components 17, 18.

The generation of defects can, in this connection, be achieved by different or combined degradation mechanisms such as, for example, sublimation or chemical reaction, it being possible in this connection for the degradation to be initiated thermally and/or photochemically, for example.

FIG. 3b shows a focused light beam 14, the focus of which is preferably in the plane of detachment 9. It is conceivable here that the light beam 14 is focused through one or more focusing bodies, more particularly lens(es) (not shown). In this embodiment, the solid-state starting material 6 is multilayered and preferably has a semitransparent or transparent substrate layer 20 which preferably consists of sapphire or comprises sapphire. The light beam 14 gets through the substrate layer 20 onto the plane of detachment 9, which is formed by an activation layer 16, the activation layer 16 being treated by the radiation 14 such that a partial or complete degradation of the activation layer 16 is brought about thermally and/or photochemically in the focus or in the region of the focus.

It is likewise conceivable that the defects 19 for generating the detachment layer 9 are generated in the region of or exactly on an interface between the solid-state piece 7 and the substrate layer 20. Thus, it is likewise conceivable that the solid-state piece 7 is generated on a support layer, more particularly a substrate layer 20, and a plane of detachment 9 for the detachment or separation of the solid-state piece 7 is generatable by means of one or more activation layers 16 and/or by means of the generation of defects 19 in an interface, more particularly between the solid-state piece 7 and the support layer.

Figure 4:
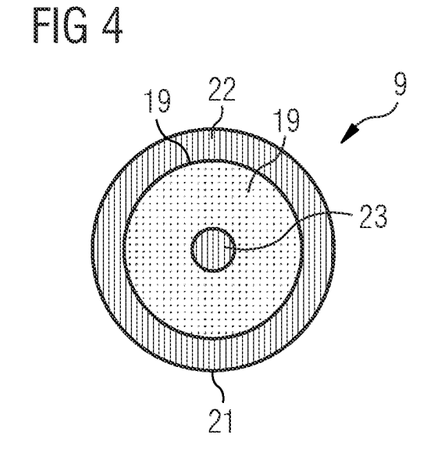
FIG. 4 shows a schematic representation of the plane of detachment.

FIG. 4 shows a plane of detachment 9 which comprises regions having different defect concentrations 21, 22, 23. It is conceivable here that a multiplicity of regions having different defect concentrations 21, 22, 23 form a plane of detachment 9, it likewise being imaginable that the defects 19 in the plane of detachment 9 are distributed substantially or exactly uniformly across the area.

The different defect concentrations 21, 22, 23 can, in terms of area, be the same or different. Preferably, a first elevated defect concentration is a crack-initiation concentration 21, which is preferably generated in the region of the edge or in a manner extending toward the edge or adjacently to the edge.

Additionally or alternatively, a crack-guidance concentration 22 can be configured such that it is possible to regulate or control the crack which separates the solid-state piece 7 from the solid-state starting material 6.

Furthermore, it is additionally or alternatively possible to generate a center concentration 23, which preferably allows a highly planar surface in the region of the center of the solid-state starting material 6.

Preferably, the crack-guidance concentration 22 is partly or completely annular or enclosing and thus encloses, preferably sectionally and particularly preferably completely, the center of the solid-state starting material 6 or of the solid-state piece 7.

It is further conceivable that the crack-guidance concentration 22 decreases in stages or steadily or smoothly in a proceeding from the edge of the solid-state starting material 6 and in the direction of the center of the solid-state starting material 6. Furthermore, it is conceivable that the crack-guidance concentration 22 is band-like and homogeneous or substantially or exactly homogeneous.

LIST OF REFERENCE SIGNS

1 Polymer hybrid material
2 Polymer matrix
3 First filler
4 Second filler
5 Third filler
6 Solid-state starting material
7 Solid-state piece
8 Absorption layer
9 Plane of detachment
10 Holding layer
11 First planar surface component
12 Second planar surface component
13 Radiation source
14 Radiation
15 Stabilization mechanism
16 Activation layer
17 First radiation component
18 Second radiation component
19 Defect
20 Substrate layer
21 Crack-initiation concentration
22 Crack-guidance concentration
23 Center concentration
24 Lower interface
25 Upper interface
X First direction
Y Second direction
Z Third direction

The invention claimed is:

1. A polymer hybrid material for use in a splitting method for dividing a solid-state starting material into at least two solid-state pieces comprising:
   a polymer matrix, and
   a first filler which is embedded in the polymer matrix and which acts as reactant, initiator, catalyst or promoter during detachment of the polymer hybrid material from the solid-state piece after the division,
   a second filler which increases adhesion of the polymer hybrid material on the solid-state starting material in comparison with a polymer hybrid material without second filler,
   wherein the first filler is distributed in the polymer matrix such that the proportion by mass of the first filler decreases proceeding from a lower interface of the polymer hybrid material, which lower interface is connected directly or indirectly via a further layer to the solid-state starting material during the splitting method, in the direction of an upper interface of the polymer hybrid material that is arranged opposite to the lower interface.

2. The polymer hybrid material as claimed in claim 1, wherein a lower region of the polymer hybrid material that directly adjoins to the lower interface and/or an upper region of the polymer hybrid material that directly adjoins to the upper interface does not comprise first filler.

3. The polymer hybrid material as claimed in claim 1, wherein the first filler can react with a reactant to release a gaseous product.

4. The polymer hybrid material as claimed in claim 1, wherein the first filler has a higher thermal diffusivity than the polymer of the polymer matrix.

5. The polymer hybrid material as claimed in claim 1, wherein the second filler is distributed in the polymer matrix such that the proportion by mass of the second filler increases in the direction of the lower interface.

6. The polymer hybrid material as claimed in claim 1, wherein the second filler is activatable by low-temperature plasma.

7. The polymer hybrid material as claimed in claim 1, further comprising:
   a third filler which has a higher thermal diffusivity and/or a higher modulus of elasticity in comparison with the polymer of the polymer matrix.

8. The polymer hybrid material as claimed in claim 7, wherein the third filler is distributed in the polymer matrix such that the proportion by mass of the third filler increases in the direction of the upper interface.

9. The polymer hybrid material as claimed in claim 1, wherein the first filler comprises at least one iron, zinc and/or copper.

10. The polymer hybrid material as claimed in claim 1, wherein the proportion by mass of the polymer matrix, based on the polymer hybrid material, is from 80% to 99%.

11. The polymer hybrid material as claimed in claim 1, wherein one or more of the fillers comprise inorganic or organic fibers, core-shell particles or silica and/or wherein the polymer hybrid material comprises a further filler comprising inorganic or organic fibers, core-shell particles or silica.

12. The polymer hybrid material as claimed in claim 1, wherein one or more of the fillers comprise carbon in the form of carbon black, graphite, chopped carbon fibers or carbon nanofibers.

13. A film comprising a polymer hybrid material as claimed in claim 1.

14. A splitting method for dividing a solid-state starting material into at least two solid-state pieces, comprising the following steps:
a) providing the solid-state starting material having at least one exposed surface,
b) applying a polymer hybrid material as claimed in claim 1 or a film comprising said polymer hybrid material to at least one exposed surface of the solid-state starting material, resulting in a composite structure,
c) treating the composite structure with a stress field such that the solid-state starting material is split into at least two solid-state pieces along a plane of detachment within the solid-state starting material,
d) removing the polymer hybrid material or the film from the solid-state piece,
wherein the polymer hybrid material or the film and/or the solid-state starting material is activated by means of low-temperature plasma before the application according to step b).

15. The splitting method as claimed in claim 14, wherein a sacrifice layer is first applied to the exposed surface of the solid-state starting material (6) and then the polymer hybrid material or the film is applied to the sacrifice layer, with the result that the composite structure comprises the solid-state starting material, the sacrifice layer and the polymer hybrid material or the film.

16. The splitting method as claimed in claim 15, wherein the sacrifice layer is activated by means of low-temperature plasma before the application according to step b).

17. The splitting method as claimed in claim 15, wherein, in step b), the film is applied to at least one surface of the solid-state starting material or to the sacrifice layer by means of lamination or adherence.

18. The splitting method as claimed in claim 14, wherein defects are generated in the solid-state starting material by at least one radiation source to specify the plane of detachment.

19. The splitting method as claimed in claim 14, wherein the polymer hybrid material or the film is removed from the solid-state piece by treatment with an apolar solvent, more particularly an aliphatic or aromatic hydrocarbon.

20. The splitting method as claimed in claim 14, wherein the polymer hybrid material or the film is removed from the solid-state piece by sequential treatment with a polar solvent and an apolar solvent.

21. The splitting method as claimed claim 14, wherein the polymer hybrid material or the film is removed from the solid-state piece by spatially resolved ultrasound treatment or megasound treatment.

22. The splitting method as claimed in claim 14, wherein the polymer hybrid material or the film is removed from the solid-state piece in a roll-to-roll process.

23. The splitting method as claimed in claim 22, wherein a temporary auxiliary support is adhesively bonded and/or hot-laminated onto the polymer hybrid material or the film.

24. The use of a polymer hybrid material as claimed in claim 1 or of a film comprising said polymer hybrid material in a splitting method for dividing a solid-state starting material into at least two solid-state pieces.

25. A polymer hybrid material for use in a splitting method for dividing a solid-state starting material into at least two solid-state pieces comprising:
a polymer matrix, and
a first filler which is embedded in the polymer matrix and which acts as reactant, initiator, catalyst or promoter during detachment of the polymer hybrid material from the solid-state piece after the division and, as a result, leads to a more rapid detachment of the polymer hybrid material from the solid-state piece after the division in comparison with a polymer material without first filler,
a second filler which increases adhesion of the polymer hybrid material on the solid-state starting material in comparison with a polymer hybrid material without second filler,
wherein a lower interface of the polymer hybrid material is connected directly or indirectly via a further layer to the solid-state starting material during the splitting method,
wherein a lower region of the polymer hybrid material that directly adjoins to the lower interface and/or an upper region of the polymer hybrid material that directly adjoins to an upper interface of the polymer hybrid material opposite the lower interface does not comprise the first filler.

26. A polymer hybrid material for use in a splitting method for dividing a solid-state starting material into at least two solid-state pieces comprising:
a polymer matrix, and
a first filler which is embedded in the polymer matrix and which acts as reactant, initiator, catalyst or promoter during detachment of the polymer hybrid material from the solid-state piece after the division and, as a result, leads to a more rapid detachment of the polymer hybrid material from the solid-state piece after the division in comparison with a polymer material without first filler,
a second filler which increases adhesion of the polymer hybrid material on the solid-state starting material in comparison with a polymer hybrid material without second filler,
wherein a lower interface of the polymer hybrid material is connected directly or indirectly via a further layer to the solid-state starting material during the splitting method,
wherein the second filler is distributed in the polymer matrix such that the proportion by mass of the second filler increases in the direction of the lower interface.

* * * * *

UNITED STATES PATENT AND TRADEMARK OFFICE
CERTIFICATE OF CORRECTION

Page 1 of 1

PATENT NO. : 10,858,495 B2
APPLICATION NO. : 16/084847
DATED : December 8, 2020
INVENTOR(S) : Beyer et al.

It is certified that error appears in the above-identified patent and that said Letters Patent is hereby corrected as shown below:

In the Claims

Column 24, Line 66 (Claim 9, Line 2), please insert -- of aluminum, -- before "iron"

Signed and Sealed this
Ninth Day of March, 2021

Drew Hirshfeld
*Performing the Functions and Duties of the*
*Under Secretary of Commerce for Intellectual Property and*
*Director of the United States Patent and Trademark Office*